US010852480B2

(12) United States Patent
Su et al.

(10) Patent No.: US 10,852,480 B2
(45) Date of Patent: Dec. 1, 2020

(54) METHOD FOR OPTICAL WAVEGUIDE FABRICATION USING POLYSILOXANE, EPOXY, PHOTO ACID GENERATOR, AND HYDROSILATION CATALYST

(71) Applicants: Dow Global Technologies LLC, Midland, MI (US); Dow Silicones Corporation, Midland, MI (US)

(72) Inventors: Kai Su, Midland, MI (US); Brandon W. Swatowski, Sanford, MI (US); Maynard G. Hyer, Sanford, MI (US); William K. Weidner, Bay City, MI (US)

(73) Assignees: Dow Global Technologies LLC, Midland, MI (US); Dow Silicones Corporation, Midland, MI (US)

(*) Notice: Subject to any disclaimer, the term of this patent is extended or adjusted under 35 U.S.C. 154(b) by 0 days.

(21) Appl. No.: 16/629,127

(22) PCT Filed: Jul. 9, 2018

(86) PCT No.: PCT/US2018/041248
§ 371 (c)(1),
(2) Date: Jan. 7, 2020

(87) PCT Pub. No.: WO2019/040191
PCT Pub. Date: Feb. 28, 2019

(65) Prior Publication Data
US 2020/0292754 A1 Sep. 17, 2020

Related U.S. Application Data

(60) Provisional application No. 62/549,641, filed on Aug. 24, 2017.

(51) Int. Cl.
*G02B 6/138* (2006.01)
*G02B 6/122* (2006.01)
*G02B 6/132* (2006.01)
*G03F 7/00* (2006.01)
*G03F 7/038* (2006.01)
*G03F 7/075* (2006.01)
*C08G 77/08* (2006.01)

(52) U.S. Cl.
CPC ............ *G02B 6/138* (2013.01); *G02B 6/122* (2013.01); *G02B 6/132* (2013.01); *G03F 7/0035* (2013.01); *G03F 7/038* (2013.01); *G03F 7/0757* (2013.01); *C08G 77/08* (2013.01)

(58) Field of Classification Search
CPC ........ G02B 6/138; G02B 6/122; G02B 6/132; G02B 1/04; G03F 7/0035; G03F 7/038; G03F 7/0757; C08G 77/08
See application file for complete search history.

(56) References Cited

U.S. PATENT DOCUMENTS

| 6,832,036 | B2 * | 12/2004 | Ghoshal | G02B 1/046 |
| | | | | 385/143 |
| 7,844,153 | B2 * | 11/2010 | Watanabe | C09D 183/06 |
| | | | | 385/123 |
| 8,175,439 | B2 | 5/2012 | Fujiue et al. | |
| 10,754,094 | B2 * | 8/2020 | Su | G02B 6/122 |
| 2004/0076391 | A1 | 4/2004 | Ghoshal et al. | |
| 2008/0032061 | A1 | 2/2008 | Watanabe et al. | |
| 2009/0074374 | A1 * | 3/2009 | Fujiue | C08G 59/22 |
| | | | | 385/142 |
| 2020/0174190 | A1 * | 6/2020 | Su | G03F 7/038 |

FOREIGN PATENT DOCUMENTS

| EP | 1142928 | 10/2001 |
| WO | 2008027280 | 3/2008 |
| WO | 2009021256 | 2/2009 |
| WO | 2019040192 | 2/2019 |
| WO | 2019040193 | 2/2019 |

OTHER PUBLICATIONS

Soma, et al., Fabrication of a Graded-Index Circular-Core Polymer Parallel Optical Waveguide Using a Microdispenser for a High-Density Optical Printed Curcuit Board, IEEE Journal of Selected Topics in Quantum Electronics, vol. 19, No. 2, Mar./Apr. 2013.
Kinoshita, et al., Polymer Optical Waveguides With GI and W-Shaped Cores for High-Bandwidth-Density On-Board Interconnects, Journal of Lightwave Technology, vol. 31, No. 24, Dec. 15, 2011.
Tahayama, et al., Significant Reduction of Crossing Loss using Polynorbornene based GI-core Optical Waveguide, Information & Telecommunication Materials Lab., Sumitomo Bakelite Co., Ltd., Japan.
Mori, et al., Optical and electrical hybrid flexible printed curcuit boards with unique photo-defined polymer waveguide layers, Invited Paper, Sumitomo Bakelite Co., Ltd., COIN project team, Japan, Proc of SPIE vol. 7607 7607OS-1 to 79070S-11.

* cited by examiner

*Primary Examiner* — Andrew Jordan

(57) ABSTRACT

A method for producing an optical waveguide by: (a) depositing a first composition comprising: (i) a polysiloxane comprising epoxy and alkenyl groups, and (ii) a compound comprising an epoxy group, having molecular weight no greater than 1000 and a refractive index of at least 1.47 and (iii) a photo acid generator; and (iv) a hydrosilation catalyst (b) curing the first composition by exposure to ultraviolet light; (c) removing at least a part of the uncured portion of the first composition to produce a final patterned core layer; (d) depositing on the final patterned core layer a second composition comprising: (i) a polysiloxane comprising epoxy groups and alkenyl groups, and (ii) a compound comprising an epoxy group and a silicon-hydrogen bond, having molecular weight no greater than 1000 and a refractive index no greater than 1.45; (iii) a photo acid generator (e) heating at a temperature from 20 to 150° C. for 0.1 to 120 minutes; and (f) curing by exposure to ultraviolet light.

10 Claims, No Drawings

METHOD FOR OPTICAL WAVEGUIDE FABRICATION USING POLYSILOXANE, EPOXY, PHOTO ACID GENERATOR, AND HYDROSILATION CATALYST

This invention relates to a method for optical waveguide fabrication capable of producing optical waveguides having a refractive index gradient.

Waveguides having core and clad structures, in which the core has a higher refractive index than the clad have been produced by using materials with different refraction index and also allowing a species having a different refractive index to diffuse into either structure, followed by curing. This method is used, e.g., in Ishigure et al., *IEEE Journal of Selected Topics in Quantum Electronics*.

The problem solved by this invention is the need for improved methods to produce optical waveguides having a refractive index gradient.

STATEMENT OF THE INVENTION

The present invention provides a method for producing an optical waveguide; said method comprising steps of: (a) depositing on a substrate a first composition comprising: (i) a first polysiloxane comprising epoxy groups and alkenyl groups, and (ii) at least one first compound comprising an epoxy group, having molecular weight no greater than 1000 and a refractive index of at least 1.47; and (iii) a photo acid generator; and (iv) a hydrosilation catalyst (b) curing the first composition by exposure to ultraviolet light through a mask to produce a patterned core layer comprising a cured portion of the first composition and an uncured portion of the first composition; (c) removing at least a part of the uncured portion of the first composition to produce a final patterned core layer; (d) depositing on the final patterned core layer a second composition comprising: (i) a second polysiloxane comprising epoxy groups, (ii) at least one second compound comprising an epoxy group and a silicon-hydrogen bond, having molecular weight no greater than 1000 and a refractive index no greater than 1.45; and (iii) at least one photo acid generator, to produce a composite; (e) heating the composite at a temperature from 20 to 150° C. for 0.1 to 120 minutes; (f) curing by exposure to ultraviolet light; and (g) heating at a temperature from 60 to 210° C. for 0.1 to 10 hours.

DETAILED DESCRIPTION

Percentages are weight percentages (wt %) and temperatures are in ° C. unless specified otherwise. Operations were performed at room temperature unless specified otherwise. Alkyl groups are saturated hydrocarbyl groups that may be straight or branched. Preferably, alkyl groups have from one to six carbon atoms, preferably one or two. Preferably, alkyl groups are unsubstituted. Aryl groups are substituent groups derived from aromatic hydrocarbon compounds which can be mono- or poly-nuclear. Aryl groups may be substituted by $C_1$-$C_4$ alkyl and/or $C_1$-$C_4$ alkoxy groups. Preferably, aryl groups are unsubstituted.

As used herein, unless otherwise indicated, molecular weights, $M_n$, $M_w$ and $M_z$ have the conventional meanings and are determined by gel permeation chromatography. Molecular weights are reported herein in units of g/mol. Refractive indices are measured at 25° C. at the sodium D-line (589 nm).

In a preferred embodiment of the invention, the substrate comprises a non-reactive material coated with a lower clad layer with a refractive index at least 0.004 lower than the refractive index of the film made from the core material and a thickness of at least 20 microns. Preferably, the non-reactive material is silicon, glass, polyimide or FR4 board (FR4 is a glass fiber epoxy laminate). Other plastic or metal disks will work, but need to be stable up to at least 100° C., preferably at least 300° C. without deformation. Preferably, the non-reactive material is substantially planar, e.g., wafer, board, disk or film. Preferably, the lower clad layer is a cured film derived from a composition that comprises: (i) a polysiloxane comprising epoxy groups and aryl groups; (ii) at least one compound comprising an epoxy group, having molecular weight no greater than 1000; (iii) at least one compound comprising at least two epoxy groups and having molecular weight no greater than 1000 and a refractive index no greater than 1.49; and (iv) at least one photo acid generator. Preferably, the amount of photo acid generator is from 0.05 to 6 wt %; preferably at least 0.1 wt %; preferably no more than 4 wt %, preferably no more than 2 wt %, preferably no more than 1 wt %, preferably no more than 0.5 wt %. Preferably, the polysiloxane (i) comprises from 1 to 20 mole % (preferably 3 to 15 mole %, preferably 5 to 13 mole %, preferably 6 to 12 mole %, preferably 7 to 12 mole %) of a unit having formula $R^1R^2R^3SiO_{1/2}$, wherein $R^1$, $R^2$ and $R^3$ independently are $C_1$-$C_{12}$ alkyl, preferably $C_1$-$C_6$ alkyl, preferably $C_1$-$C_4$ alkyl, preferably methyl or ethyl, preferably methyl. Preferably, the polysiloxane comprises from 15 to 40 mole % (preferably 18 to 35 mole %, preferably 20 to 32 mole %, preferably 21 to 29 mole %, preferably 22 to 27 mole %) of a unit having formula $ArSiO_{3/2}$, wherein Ar is $C_6$-$C_{20}$ aryl, preferably $C_6$-$C_{15}$ aryl, preferably $C_6$-$C_{12}$ aryl, preferably phenyl. Preferably, the polysiloxane comprises from 25 to 60 mole % (preferably 30 to 55 mole %, preferably 33 to 50 mole %, preferably 36 to 46 mole %) of a unit having formula $EpSiO_{3/2}$, wherein Ep is $C_3$-$C_{20}$ alkyl substituted with an epoxy group, preferably $C_4$-$C_{15}$ alkyl substituted with an epoxy group, preferably $C_5$-$C_{10}$ alkyl substituted with an epoxy group, preferably $C_5$-$C_{10}$ alkyl comprising cyclohexyl fused to an ethylene oxide ring, preferably 2-(3,4-epoxycyclohexyl)ethyl. Preferably, the polysiloxane comprises from 28 to 65 mole % (preferably 30 to 60 mole %, preferably 33 to 56 mole %, preferably 36 to 52 mole %) of a unit having formula $R^4SiO_{3/2}$, wherein $R^4$ is $C_1$-$C_{12}$ alkyl, preferably $C_1$-$C_6$ alkyl, preferably $C_1$-$C_4$ alkyl, preferably methyl or ethyl, preferably methyl. Preferably, the compound (ii) comprising an epoxy group, having molecular weight no greater than 700 and a refractive index of at least 1.47 has a molecular weight from 100 to 600, preferably 150 to 500, preferably 180 to 400. Preferably, the compound has a refractive index of at least 1.47, preferably at least 1.50, preferably at least 1.52; preferably no greater than 1.6, preferably no greater than 1.55. Preferably, the compound is a silicon-containing compound, preferably a silane compound. Preferably, the compound comprises a $C_6$-$C_{20}$ aryl substituent, preferably $C_6$-$C_{15}$ aryl, preferably $C_6$-$C_{12}$ aryl, preferably phenyl. Preferably, the epoxy group is part of a $C_3$-$C_{20}$ alkyl group, preferably $C_4$-$C_{15}$ alkyl, preferably $C_4$-$C_{10}$ alkyl, preferably $C_5$-$C_{10}$ alkyl comprising cyclohexyl fused to an ethylene oxide ring, preferably 2-(3,4-epoxycyclohexyl)ethyl. Preferably, the compound is 2-(3,4-epoxycyclohexyl)ethyldimethylphenylsilane. Preferably, the compound (iii) comprising at least two epoxy groups and having molecular weight no greater than 1000 and a refractive index no greater than 1.49 has a molecular weight from 100 to 700, preferably 150 to 600, preferably 200 to 500. Preferably, the compound has a refractive index no greater than 1.48, preferably no greater than 1.47, preferably no greater than 1.46; preferably at least 1.3, preferably at least 1.35. Preferably, the compound is a silicon-containing compound, preferably a siloxane compound. Preferably, hydrocarbyl substituents attached to silicon which do not comprise epoxy groups are $C_1$-$C_4$ alkyl groups, preferably methyl. Preferably, the epoxy group is part of a $C_3$-$C_{20}$ alkyl group, preferably $C_4$-$C_{15}$ alkyl, preferably $C_4$-$C_{10}$ alkyl, preferably $C_5$-$C_{10}$ alkyl comprising cyclohexyl fused to an ethylene oxide ring, preferably 2-(3,4-epoxycyclohexyl)ethyl. Preferably, the compound is 1,3-bis(2-(3,4-epoxycyclohexyl)ethyl) tetramethyldisiloxane. Preferably, the lower clad comprises 2-(3,4-Epoxycyclohexyl)ethyl dimethylphenylsilane (structure I below) and 1,3-bis(2-(3,4-epoxycyclohexyl)ethyl) tetramethyldisiloxane (structure II below). Preferably, the components are coated on the non-reactive material in an organic medium, preferably decanol. Preferably, the final formulation is cured with UV light to achieve a film refractive index that is 0.002 lower than the core.

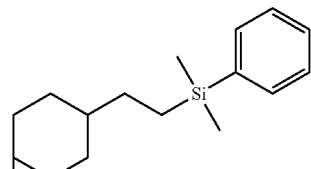

I

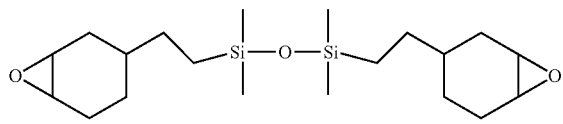

II

Preferably, the lower clad layer comprises from 15 to 55 wt % of polysiloxane(s) comprising epoxy groups and aryl groups, preferably at least 20 wt %, preferably at least 25 wt %, preferably at least 30 wt %; preferably no more than 50 wt %, preferably no more than 45 wt %, preferably no more than 40 wt %. Preferably, the lower clad layer comprises from 10 to 40 wt % of compound(s) comprising an epoxy group, having molecular weight no greater than 1000 and a refractive index of at least 1.47, preferably at least 15 wt %, preferably at least 20 wt %; preferably no more than 35 wt %, preferably no more than 30 wt %. Preferably, the lower clad layer comprises from 20 to 60 wt % of compound(s) comprising at least two epoxy groups and having molecular weight no greater than 1000 and a refractive index no greater than 1.49, preferably at least 25 wt %, preferably at least 30 wt %, preferably at least 35 wt %; preferably no more than 55 wt %, preferably no more than 50 wt %, preferably no more than 45 wt %. Preferably, the lower clad layer comprises from 0.05 to 2 wt % of photo acid generator. All weight percentages are on a solids basis, i.e., excluding solvent(s). Preferably, the lower clad layer is cured by exposure to ultraviolet light.

The first composition comprises: (i) a first polysiloxane comprising epoxy groups and alkenyl groups, and (ii) at least one first compound comprising an epoxy group, having molecular weight no greater than 1000 and a refractive index of at least 1.47, (iii) at least one photoacid generator; and (iv) at least one hydrosilation catalyst. Preferably, the first polysiloxane comprising epoxy groups and alkenyl groups comprises from 25 to 60 mole % (preferably 30 to 55 mole %, preferably 33 to 50 mole %, preferably 36 to 46 mole %) of a unit having formula $Ep^1SiO_{3/2}$, wherein $Ep^1$ is $C_3$-$C_{20}$ alkyl substituted with an epoxy group, preferably $C_4$-$C_{15}$ alkyl substituted with an epoxy group, preferably $C_5$-$C_{10}$ alkyl substituted with an epoxy group, preferably $C_5$-$C_{10}$ alkyl comprising cyclohexyl fused to an ethylene oxide ring, preferably 2-(3,4-epoxycyclohexyl)ethyl. Preferably, the first polysiloxane comprises from 25 to 65 mole % (preferably 32 to 60 mole %, preferably 37 to 55 mole %, preferably 40 to 52 mole %) of a unit having formula $Ar^1SiO_{3/2}$, wherein $Ar^1$ is $C_6$-$C_{20}$ aryl, preferably $C_6$-$C_{15}$ aryl, preferably $C_6$-$C_{12}$ aryl, preferably phenyl. Preferably, the first polysiloxane comprises from 2 to 20 mole % (preferably 4 to 18 mole %, preferably 5 to 17 mole %, preferably 7 to 16 mole %, preferably 9 to 15 mole %) of a unit having formula $R^5R^6R^7SiO_{1/2}$, wherein $R^5$ and $R^6$ independently are $C_1$-$C_{12}$ alkyl, preferably $C_1$-$C_6$ alkyl, preferably $C_1$-$C_4$ alkyl, preferably methyl or ethyl, preferably methyl; and $R^7$ is $C_2$-$C_{12}$ alkenyl, preferably $C_2$-$C_6$ alkenyl, preferably $C_2$-$C_4$ alkenyl, preferably vinyl. Preferably, the first compound comprising an epoxy group, having molecular weight no greater than 1000 and a refractive index of at least 1.47 has a molecular weight from 100 to 700, preferably 150 to 500, preferably 180 to 400. Preferably, the first compound has a refractive index of at least 1.47, preferably at least 1.50, preferably at least 1.52; preferably no greater than 1.7, preferably no greater than 1.65. Preferably, the first compound is a silicon-containing compound, preferably a silane compound. Preferably, the first compound comprises a $C_6$-$C_{20}$ aryl substituent, preferably $C_6$-$C_{15}$ aryl, preferably $C_6$-$C_{12}$ aryl, preferably phenyl. Preferably, the epoxy group is part of a $C_3$-$C_{20}$ alkyl group, preferably $C_4$-$C_{15}$ alkyl, preferably $C_4$-$C_{10}$ alkyl, preferably 2-(3,4-epoxycyclohexyl)ethyl. Preferably, the first compound is 2-(3,4-epoxycyclohexyl)ethyldimethylphenylsilane. Preferably, the first composition has a refractive index of at least 1.47, preferably at least 1.50, preferably at least 1.52.

Preferably, the first composition comprises from 20 to 99.9 wt % of first polysiloxane(s), preferably at least 40 wt %, preferably at least 60 wt %; preferably no more than 90 wt %, preferably no more than 99.9 wt %. Preferably, the first composition comprises from 0.1 to 80 wt % of first compound(s), preferably at least 20 wt %, preferably at least 30 wt %; preferably no more than 70 wt %, preferably no more than 40 wt %.

Preferably, the first composition further comprises a hydrosilylation catalyst, preferably a platinum compound or complex, e.g., $H_2PtCl_6$, di-µ-carbonyldi-π-cyclopentadienyldinickel, a platinum-carbonyl complex, a platinum-divinyltetramethyldisiloxane complex, a platinum cyclovinylmethylsiloxane complex and platinum acetylacetonate (acac). Other typical hydrosilylation catalysts include nickel and rhodium compounds, e.g., $Rh(acac)_2(CO)_2$ and $Ni(acac)_2$. Preferably, the hydrosilylation catalyst is present in the first composition in an amount from 0.1 to 100 ppm, preferably at least 0.5 ppm, preferably at least 1 ppm, preferably at least 2 ppm, preferably at least 3 ppm; preferably no more than 100 ppm, preferably no more than 50 ppm, preferably no more than 30 ppm, preferably no more than 15 ppm, preferably no more than 10 ppm.

The second composition comprises: (i) a second polysiloxane comprising epoxy groups, (ii) at least one second compound comprising an epoxy group and a silicon-hydrogen bond, having molecular weight no greater than 1000 and a refractive index no greater than 1.48 and (iii) at least one photo acid generator. Preferably, the second polysiloxane comprising epoxy groups comprises from 25 to 60 mole % (preferably 30 to 55 mole %, preferably 33 to 50 mole %, preferably 36 to 46 mole %) of a unit having formula $Ep^2SiO_{3/2}$, wherein $Ep^2$ is $C_3$-$C_{20}$ alkyl substituted with an epoxy group, preferably $C_4$-$C_{15}$ alkyl substituted with an epoxy group, preferably $C_5$-$C_{10}$ alkyl substituted with an epoxy group, preferably $C_5$-$C_{10}$ alkyl comprising cyclohexyl fused to an ethylene oxide ring, preferably 2-(3,4-epoxycyclohexyl)ethyl. Preferably, the second polysiloxane comprises from 25 to 65 mole % (preferably 32 to 60 mole %, preferably 37 to 55 mole %, preferably 40 to 52 mole %) of a unit having formula $Ar^2SiO_{3/2}$, wherein $Ar^2$ is $C_6$-$C_{20}$ aryl, preferably $C_6$-$C_{15}$ aryl, preferably $C_6$-$C_{12}$ aryl, preferably phenyl. Preferably, the second polysiloxane comprises from 2 to 20 mole % (preferably 4 to 18 mole %, preferably 5 to 17 mole %, preferably 7 to 16 mole %, preferably 9 to 15 mole %) of a unit having formula $R^8R^9R^{10}SiO_{1/2}$, wherein $R^8$, $R^9$ and $R^{10}$ independently are $C_1$-$C_{12}$ alkyl, preferably $C_1$-$C_6$ alkyl, preferably $C_1$-$C_4$ alkyl, preferably methyl or ethyl, preferably methyl; Preferably, the second compound comprising an epoxy group and a silicon-hydrogen bond, having molecular weight no greater than 1000 and a refractive index no greater than 1.48 has a refractive index no greater than 1.47, preferably no greater than 1.46, preferably no greater than 1.45; preferably at least 1.2, preferably at least 1.3. Preferably, the second compound has a molecular weight from 100 to 600, preferably 150 to 500, preferably 180 to 400. Preferably, the compound is a disiloxane. Preferably, the epoxy group is part of a $C_3$-$C_{20}$ alkyl group, preferably $C_4$-$C_{15}$ alkyl, preferably $C_4$-$C_{10}$ alkyl, preferably 2-(3,4-epoxycyclohexyl)ethyl. Preferably, the epoxy group and the hydrogen bonded to silicon are attached to different silicon atoms. Preferably, the second compound is 2-(3,4-epoxycyclohexyl)ethyltetramethyldisiloxane.

Preferably, the second composition comprises from 20 to 99.9 wt % of second polysiloxane(s), preferably at least 30 wt %, preferably at least 45 wt %; preferably no more than 90 wt %, preferably no more than 99.9 wt %. Preferably, the second composition comprises from 0.1 to 80 wt % of second compound(s), preferably at least 20 wt %, preferably at least 45 wt %; preferably no more than 70 wt %, preferably no more than 80 wt %. Preferably the second composition comprises 0.01 to 5 wt % photo acid generator; preferably at least 0.05 wt %, preferably at least 0.1 wt %; preferably no more than 3 wt %, preferably no more than 1 wt %.

In step (e), preferably the composite is heated at a temperature of at least 30° C., preferably at least 45° C., preferably at least 50° C.; preferably no more than 120° C., preferably no more than 100° C., preferably no more than 80° C. Preferably, the composite is heated for 0.5 to 50 minutes, preferably 1 to 5 minutes. The heated composite is then cured via ultraviolet light.

Preferably, curing via ultraviolet light is performed at a wavelength from 180 nm to 450 nm, preferably 300 to 400 nm. Preferably, the dose level is from 5 to 3000 mJ/cm², preferably from 50 to 2000 mJ/cm², preferably from 800 to 1800 mJ/cm². Preferably, a photo acid generator is present in the composition to be cured. Photo acid generators are well known, see, e.g., EP1142928. Examples of classes of photo acid generators are onium salts, diazoketones, sulfones and sulfonates. Onium salts include iodonium salts, sulfonium salts, phosphonium salts, diazonium salts and pyridinium salts. Especially preferred photo acid generators include triarylsulfonium salts of sulfonic acids, diaryliodonium salts of perfluoroalkylsulfonic acids, diaryliodonium salts of sulfonic acids, diaryliodonium salts of boronic acids and triarylsulfonium salts of boronic acids.

Preferred organic media for removing uncured material from the composite in step (c) include, e.g., alcohols (e.g., isopropanol), glycol ether acetates (e.g., diethylene glycol monoethyl ether acetate), toluene, ethers.

Preferably, the thickness of the lower clad layer is from 20 to 200 microns, preferably 100 to 200 microns. Preferably, the thickness of the core layer (cured first composition) is from 40 to 70 microns, preferably 45 to 55 microns.

Preferably, following the curing in step (f) (step f is UV curing, heating is after UV curing) of the method of this invention, the cured composite is heated at a temperature from 80 to 150° C. (preferably 100 to 140° C.) for 0.2 to 8 hours, preferably 0.5 to 5 hours.

The compositions of this invention may include optional ingredients such as photosensitizers, fillers, high release additives, reactive diluents, photochromic materials, dyes, colorants, preservatives, and other radiation curable compounds.

EXAMPLES

Example 1

Core Formulation

A sample of 108 g of mixture of $(PhSiO_{3/2})_{0.45}(RSiO_{3/2})_{0.41}(ViMe_2SiO_{1/2})_{0.13}$ formulation in which R=2-(3,4-Epoxycyclohexyl)ethyl or —CH$_2$CH$_2$C$_6$H$_9$O) and 2-(3,4-Epoxycyclohexyl)ethyl dimethylphenylsilane was mixed with a 0.13 g Karstedt's Pt catalyst (platinum-divinyltetramethyldisiloxane complex) that was dissolved in $(PhSiO_{3/2})_x(HMe_2SiO_{1/2})_y$ (0.14%), leading to a clear solution that contains 5.6 ppm of Pt. The mixture has a RI of 1.5376 (589 nm) and a viscosity of 1700 cPs at 25° C. The mixture was spun coated on a silicon wafer at 3500 rpm for 90 seconds, and the film was cured at 10 mW/cm² UV light for 120 seconds using a high pressure mercury lamp. The film was then heated in an air circulated oven for 1 hour. The resulting film has a thickness of 23.15 microns and a refractive index of 1.5324 as measured using Metricon prism coupler at 632.8 nm.

Example 2

Clad Formulation 84.9 g of resin with a $(PhSiO_{3/2})_{0.46}(RSiO_{3/2})_{0.41}(Me_3SiO_{1/2})_{0.13}$ composition in which R=2-(3,4-Epoxycyclohexyl)ethyl or —CH$_2$CH$_2$C$_6$H$_9$O), (66.6% solid resin in cyclopentylmethyl ether) was mixed with 55.95 g of silicon hydride containing epoxy monomer (HMe$_2$SiOSiMe$_2$CH$_2$CH$_2$(C$_6$H$_{10}$O) (refractive index at 589 nm at 25° C.=1.4471), followed by solvent evaporation using a rotary evaporator at 60° C. and 0-1 torr for 2 hours. A sample of 0.27 g of CPI 300 catalyst (sulfonium salt from Nagase Corp.) was then added to the solution in an amber bottle. After mixing, the solution was filtered through PTFE filter with a pore size of 0.45 micro meter. This leads to a composition of 48.4% epoxy resin, 49.7% of epoxy monomer and 0.25% CPI 300 catalyst. The mixture has a RI of 1.4611 (589 nm) and a viscosity of 55 cPs at 25° C. The mixture was spun coated on a silicon wafer at 500 rpm for 10 seconds, the film was cured at 10 mW/cm² UV light for 120 seconds (high pressure mercury lamp). The film was then heated in an air circulated oven for 1 hour. The resulting film has a thickness of 13.08 micron meter and a refractive index of 1.4858 measured using Metricon prism coupler at 632.8 nm.

Example 3

Process to Make Waveguide and Properties

A lower clad material that is 32.9 wt % $(PhSiO_{3/2})_{0.25}$ $(MeSiO_{3/2})_{0.46}$ $(RSiO_{3/2})_{0.41}(Me_3SiO_{1/2})_{0.13}$ resin in which R=2-(3,4-Epoxycyclohexyl)ethyl or $-CH_2CH_2C_6H_9O$), 22.4 wt % 2-(3,4-Epoxycyclohexyl)ethyl dimethylphenylsilane (structure I below), 36.6 wt % 1,3-bis(2-(3,4-epoxycyclohexyl)ethyl) tetramethyldisiloxane (structure II below), 7.9 wt % decanol and 0.25 wt % CPI 300 catalyst was spun down at 600 rpm on silicon for 10 seconds as a bottom cladding layer and UV catalyzed at 1200 mJ/cm$^2$

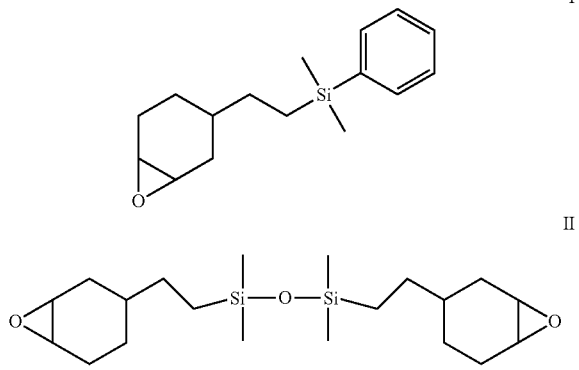

using a high pressure mercury bulb. The core (Example 1) was spun down at 1500 RPM for 30 seconds to achieve a 58 micron layer. The core was photo patterned using an 8 inch photo mask with a 50 micron proximity gap. 250 mJ/cm$^2$ dose was used to achieve a 75 micron wide feature. Diethylene glycol monoethyl ether acetate was used to develop the uncured core as well as isopropanol. A top cladding (Example 2) which contained the silicon hydride low refractive index material was deposited at 600 RPM for 10 seconds to encapsulate the core. The waveguide stack was heated on a hot plate at 60° C. for 2 minutes to diffuse the low refractive silicon hydride then UV catalyzed at 1200 mJ/cm$^2$ dose. The entire cured stack was placed in a 130° C. oven for 2 hours.

After final curing, the waveguide stack was diced and cross section imaged using phase contrast transmission microscopy, which shows that inside the core cross section there is an index gradient from the center of the core to the cladding suggesting the di-functional materials migrated into the core during the diffusion process and are creating a gradient index inside the core structure.

Further optical inspection of the waveguides in the photomask demonstrated that there was diffusion of low RI species into the core. First, the crossing losses across 90 degree crossings were on the order of 0.04 dB/xing, which is lower than the expected 0.14 dB/xing for a step index build. Second, the input coupling loss is greatly increased which indicates a numerical aperture reduction, only apparent when species have left the upper clad, raising its refractive index, or lowering the core refractive index.

| | SM Underfill (16.25 cm) | SM Underfill (94.6 cm) | 90 Degree Crossings (OM4-OM2) | Bends (OM4-OM2) | Coupling (OM4-OM2) | Coupling (OM4-OM4) |
|---|---|---|---|---|---|---|
| Pfiber (dB) | 3.08 | 3.08 | 0.08 | 0.28 | 0.57 | −1.29 |
| Pfiber (dB) | 3.04 | 3.04 | 0.16 | 0.34 | 0.61 | −1.29 |
| Channel 1 (dB) | 2.04 | −1.2 | −1.48 | −1.39 | −2.53 | −4.56 |
| Channel 2 (dB) | 2.08 | −1.2 | −1.64 | −1.48 | −2.49 | −4.59 |
| Channel 3 (dB) | 2.1 | −1.24 | −1.99 | −1.71 | −2.48 | −4.4 |
| Channel 4 (dB) | 2.09 | −1.23 | −2.21 | −2.38 | | |
| Channel 5 (dB) | 2.07 | −1.18 | −3.44 | −2.73 | | |
| Channel 6 (dB) | 2.17 | −0.84 | −4.59 | −3.12 | | |
| Average (dB) | 2.09 | −1.15 | | | −2.5 | −4.5 |
| Stdev (dB) | 0.044 | 0.15 | 1.212887739 | | 0.026 | 0.10 |

| | Average | 1σ Stdev | 1σ % Stdev | 3σ Stdev | 3σ % Stdev |
|---|---|---|---|---|---|
| OM4 Input Coupling Loss (dB) | 2.122 | 0.065 | 3.05 | 0.194 | 9.16 |
| OM4 Ouput Coupling Loss (dB) | 0.137 | 0.109 | 79.93 | 0.328 | 239.8 |
| 16.25 cm Propagation Loss (dB/cm) | 0.060 | 0.003 | 5.36 | 0.010 | 16.1 |
| 94.6 cm Propagation Loss (dB/cm) | 0.044 | 0.002 | 3.69 | 0.005 | 11.1 |
| 180° 20 mm Bend Loss (dB) | −1.470 | 0.089 | −6.04 | 0.267 | −18.13 |
| 180° 15 mm Bend Loss (dB) | −1.380 | 0.089 | −6.44 | 0.267 | −19.31 |
| 180° 11 mm Bend Loss (dB) | −1.150 | 0.089 | −7.72 | 0.267 | −23.17 |
| 180° 8 mm Bend Loss (dB) | −0.480 | 0.089 | −18.49 | 0.267 | −55.48 |

-continued

| | | | | | |
|---|---|---|---|---|---|
| 180° 6 mm Bend Loss (dB) | −0.130 | 0.089 | −68.11 | 0.267 | −204.32 |
| 180° 5 mm Bend Loss (dB) | 0.260 | 0.089 | 34.23 | 0.267 | 102.69 |
| 90° Xing Loss (dB/Xing) | 0.040 | Corelation ($R^2$) 0.980 | | | |

The invention claimed is:

1. A method for producing an optical waveguide; said method comprising steps of:
   (a) depositing on a substrate a first composition comprising: (i) a first polysiloxane comprising epoxy groups and alkenyl groups, and (ii) at least one first compound comprising an epoxy group, having molecular weight no greater than 1000 and a refractive index of at least 1.47; (iii) at least one photo acid generator (iv) at least one hydrosilation catalyst
   (b) curing the first composition by exposure to ultraviolet light through a mask to produce a patterned core layer comprising a cured portion of the first composition and an uncured portion of the first composition;
   (c) removing at least a part of the uncured portion of the first composition to produce a final patterned core layer;
   (d) depositing on the final patterned core layer a second composition comprising: (i) a second polysiloxane comprising epoxy groups, (ii) at least one second compound comprising an epoxy group and a silicon-hydrogen bond, having molecular weight no greater than 1000 and a refractive index no greater than 1.45; and (iii) at least one photo acid generator, to produce a composite;
   (e) heating the composite at a temperature from 20 to 150° C. for 0.1 to 120 minutes;
   (f) curing by exposure to ultraviolet light; and
   (g) heating at a temperature from 60 to 210° C. for 0.1 to 10 hours.

2. The method of claim 1 in which the second compound has a molecular weight from 100 to 700.

3. The method of claim 2 in which the first composition has a refractive index from 1.52 to 1.57.

4. The method of claim 3 in which the first composition comprises from 20 to 99.9 wt % of at least one first polysiloxane and from 0.1 to 80 wt % of at least one first compound.

5. The method of claim 4 in which the second composition comprises from 20 to 99.9 wt % of at least one second polysiloxane and from 0.1 to 80 wt % of at least one second compound.

6. The method of claim 5 in which the first compound comprises a $C_6$-$C_{20}$ aryl substituent and has a molecular weight from 100 to 600.

7. The method of claim 6 in which the first polysiloxane comprising epoxy groups and alkenyl groups comprises from 25 to 60 mole % of a unit having formula $Ep^1SiO_{3/2}$, wherein $Ep^1$ is $C_3$-$C_{20}$ alkyl substituted with an epoxy group, from 25 to 65 mole % of a unit having formula $Ar^1SiO_{3/2}$, wherein $Ar^1$ is $C_6$-$C_{20}$ aryl, and from 2 to 20 mole % of a unit having formula $R^5R^6R^7SiO_{1/2}$, wherein $R^5$ and $R^6$ independently are $C_1$-$C_{12}$ alkyl and $R^7$ is $C_2$-$C_{12}$ alkenyl.

8. The method of claim 7 in which the second polysiloxane comprising epoxy groups and alkenyl groups comprises from 25 to 60 mole % of a unit having formula $Ep^2SiO_{3/2}$, wherein $Ep^2$ is $C_3$-$C_{20}$ alkyl substituted with an epoxy group, from 25 to 65 mole % of a unit having formula $Ar^2SiO_{3/2}$, wherein $Ar^2$ is $C_6$-$C_{20}$ aryl, and from 2 to 20 mole % of a unit having formula $R^8R^9R^{10}SiO_{1/2}$, wherein $R^8$, $R^9$ and $R^{10}$ independently are $C_1$-$C_{12}$ alkyl.

9. The method of claim 8 in which the second compound is a disiloxane in which the epoxy group and a hydrogen bonded to silicon are attached to different silicon atoms.

10. The method of claim 9 in which $R^7$ and $R^{10}$ are vinyl, $Ar^1$ and $Ar^2$ are phenyl; $R^5$, $R^6$, $R^8$ and $R^9$ independently are $C_1$-$C_4$ alkyl; and $Ep^1$ and $Ep^2$ are $C_5$-$C_{10}$ alkyl comprising cyclohexyl fused to an ethylene oxide ring.

* * * * *